United States Patent [19]

Lalesse

[11] Patent Number: 5,067,873
[45] Date of Patent: Nov. 26, 1991

[54] METHOD OF SEPARATING A COMPONENT FROM A ROW OF COMPONENTS AND APPARATUS FOR CARRYING OUT THE METHOD

[75] Inventor: Herman C. Lalesse, Heerlen, Netherlands

[73] Assignee: U.S. Philips Corporation, New York, N.Y.

[21] Appl. No.: 460,797

[22] Filed: Jan. 4, 1990

[30] Foreign Application Priority Data

Jul. 7, 1989 [NL] Netherlands .......................... 8901742

[51] Int. Cl.⁵ ............................................... B65G 59/00
[52] U.S. Cl. ................................. 414/789.9; 221/251; 221/261; 414/786
[58] Field of Search ..................... 221/251, 261, 296; 414/224, 798.9, 786, 797.5

[56] References Cited

U.S. PATENT DOCUMENTS

| | | | |
|---|---|---|---|
| 1,153,174 | 9/1915 | Calleson | 221/293 X |
| 1,748,076 | 2/1930 | Nueske, Jr. | 221/296 |
| 1,991,223 | 2/1935 | Ledig et al. | 221/293 |
| 2,594,241 | 4/1952 | Williamson | 414/797.5 X |
| 2,604,577 | 7/1952 | Strickland, Jr. et al. | 414/224 X |
| 2,611,470 | 9/1952 | Rudolph | 414/789.9 X |
| 3,220,604 | 11/1965 | Luginbühl | 221/251 X |
| 4,466,229 | 8/1984 | Gino | 221/251 X |
| 4,865,515 | 9/1989 | Dorner et al. | 414/797.5 X |

FOREIGN PATENT DOCUMENTS

| | | |
|---|---|---|
| 0301691 | 2/1989 | European Pat. Off. . |
| 158739 | 9/1984 | Japan ............................ 414/797.5 |

Primary Examiner—David A. Bucci
Assistant Examiner—Janice Krizek
Attorney, Agent, or Firm—William Squire

[57] ABSTRACT

A row of components on a supply track are displaced by gravity to a separation station. A stop stops the row with one component at a presentation position. A separation mechanism separates the remainder of the row from the component at the presentation position by displacing the remainder of the row in a direction opposite the supply direction.

13 Claims, 3 Drawing Sheets

METHOD OF SEPARATING A COMPONENT FROM A ROW OF COMPONENTS AND APPARATUS FOR CARRYING OUT THE METHOD

BACKGROUND OF THE INVENTION

1. Field of the Invention

The invention relates to a method of separating a component from a row of components, in which the row of components is displaced in a continuous form over an elongate track in a supply direction into a separation device, after which a component, after the row has come to a standstill, is separated from the row in the separation device and is then discharged from a presentation position. The invention further relates to an apparatus for carrying out the method.

2. Description of the Prior Art

The term "components" is to be understood to mean electrical components or articles corresponding thereto in form and weight and suitable for transport over a track, which will be described more fully hereinafter.

A method of the kind mentioned in the opening paragraph and an apparatus for carrying out this method are known from European Patent Application EP-A1-0301691. In this known method, after the whole row has come to a standstill, a component is separated from the row in the separation device in that the remaining row of components is withheld for an even longer time, while the component to be separated is displaced further in the supply direction and is brought to a standstill in the presentation position.

A disadvantage of the method mentioned above is that the component to be separated must be twice brought to a standstill before the component is discharged from the presentation position. This is time-consuming and is consequently often undesirable in automatized processes. Since the apparatus necessary for carrying out the known method has two stops mutually separated in position and coupled to each other, the known apparatus is unnecessarily complicated.

SUMMARY OF THE INVENTION

The invention has for its object to provide a method of the kind described above, by means of which a separate component can be brought rapidly and in a simple manner to a presentation position. The method according to the invention is for this purpose characterized in that the remaining row of components is displaced in a continuous form over a predetermined distance from the component to be separated by means of the separation device in a direction opposite to the supply direction, and in that then the remaining row of components is kept at a predetermined distance from the separated component, while the component is discharged from the presentation position. Since the component to be separated already is located in the presentation position in the separation device, the component can be discharged from the separation device already immediately. The remaining row of components is then displaced in the supply direction until a next component to be separated is located in the separation device.

An embodiment of the method according to the invention is characterized in that the component to be separated is separated from the remaining row by exerting a force on a component in the remaining row of components by means of the separation device, the force being composed of a first component transverse to the supply direction at the area of the separation device adn a second component in the direction opposite to the supply direction. Since the direction of the force encloses an acute or an obtuse angle with the supply direction, the dimensions of the separation device can be kept comparatively small in a direction parallel to the track. Due to this force, the remaining row of components is displaced in continuous form over a predetermined distance from the component to be separated and is kept remote from the separated component. After the component has been discharged from the presentation position, the force on the component in the remaining row of components is eliminated and the remaining row is then displaced in the supply direction until a next component to be separated is located in the presentation position.

The invention further has for its object to provide an apparatus of comparatively simple construction for carrying out the method according to the invention. The apparatus is for this purpose characterized in that the separation device is provided with a stop arranged near the presentation position in the track, a carriage displaceable in a direction transverse to the track and a pressure foot displaceable under spring force with respect to the carriage upon a movement of a component in the remaining row of components in a direction opposite to the supply direction. The stop ensures that the row of components displaced over the elongate track in the supply direction is brought to a standstill in the separation device, the component to be separated being located in the presentation position. When the row of components has been brought to a standstill against the stop, the carriage performs a movement directed towards the track and the pressure foot connected to the carriage exerts a force on a component in the remaining row of components in the direction opposite to the supply direction. The point at which the force is applied to the component can be chosen at will. The force may also be applied to a component not directly adjacent the component to be separated so that one or more components are left between the row displaced in the direction opposite to the direction of supply and the component to be separated. Although the component to be separated still engages another component, it is not hindered by this component when discharging the component from the presentation position. The apparatus is thus suitable to process different types of components.

An embodiment of an apparatus for carrying out the method according to the invention is characterized in that the separation device is provided with a gripper, which is displaceable simultaneously with the carriage in a direction transverse to the direction of supply and the pressure foot connected to the carriage displaces the row of components over a predetermined distance from the component before the gripper picks up the component from the presentation position. By simultaneously displacing the gripper and the carriage, a fixed relation exists between the movements of the carriage and the gripper. Thus it is comparatively simple to control the apparatus.

A further embodiment of an apparatus for carrying out the method according to the invention is characterized in that the pressure foot is connected to the carriage by means of a blade spring. When mounting blade springs of different dimensions, it is possible to render the apparatus in a simple manner suitable for components of different dimensions and shape.

Another embodiment of the apparatus for carrying out the method according to the invention is characterized in that the pressure foot is connected to a pin slidable under spring force in a guide, the guide being connected to the carriage and enclosing an obtuse angle with the direction of supply. An advantage of this embodiment is that the pressure foot faces the component to be separated so that a largest possible number of components are displaced in the direction opposite to the supply direction.

Another embodiment of the apparatus for carrying out the method according to the invention is characterized in that the pressure foot forms part of a cam disk resiliently connected to the carriage. The cam disk guarantees a very gradual application of the force when pushing back the remaining row of components.

A still further embodiment of the apparatus for carrying out the method according to the invention is characterized in that the stop is adjustable in the supply direction. Due to this measure, the apparatus is simply adjustable for components of different dimensions.

IN THE DRAWING

The invention will be described more fully with reference to the drawing, in which:

FIG. 1 shows diagrammatically a side elevation of a first embodiment of the apparatus according to the invention for carrying out the method according to the invention, FIG. 2 is a sectional view taken on the line II—II in FIG. 1, FIG. 3 shows diagrammatically in side elevation a part of the apparatus shown in FIGS. 1 and 2 in a passive state, FIG. 4 shows diagrammatically in side elevation a part of the apparatus shown in FIGS. 1 and 2 in an active state, FIG. 5 shows diagrammatically in side elevation a part of a second embodiment of the apparatus in a passive state, FIG. 6 shows diagrammatically in side elevation a part of the second embodiment of the apparatus in an active state, FIG. 7 shows diagrammatically in side elevation a part of a third embodiment of the apparatus in a passive state, FIG. 8 shows diagrammatically in side elevation a part of the third embodiment of the apparatus in an active state.

DESCRIPTION OF THE PREFERRED EMBODIMENTS

Figures 1, 2:
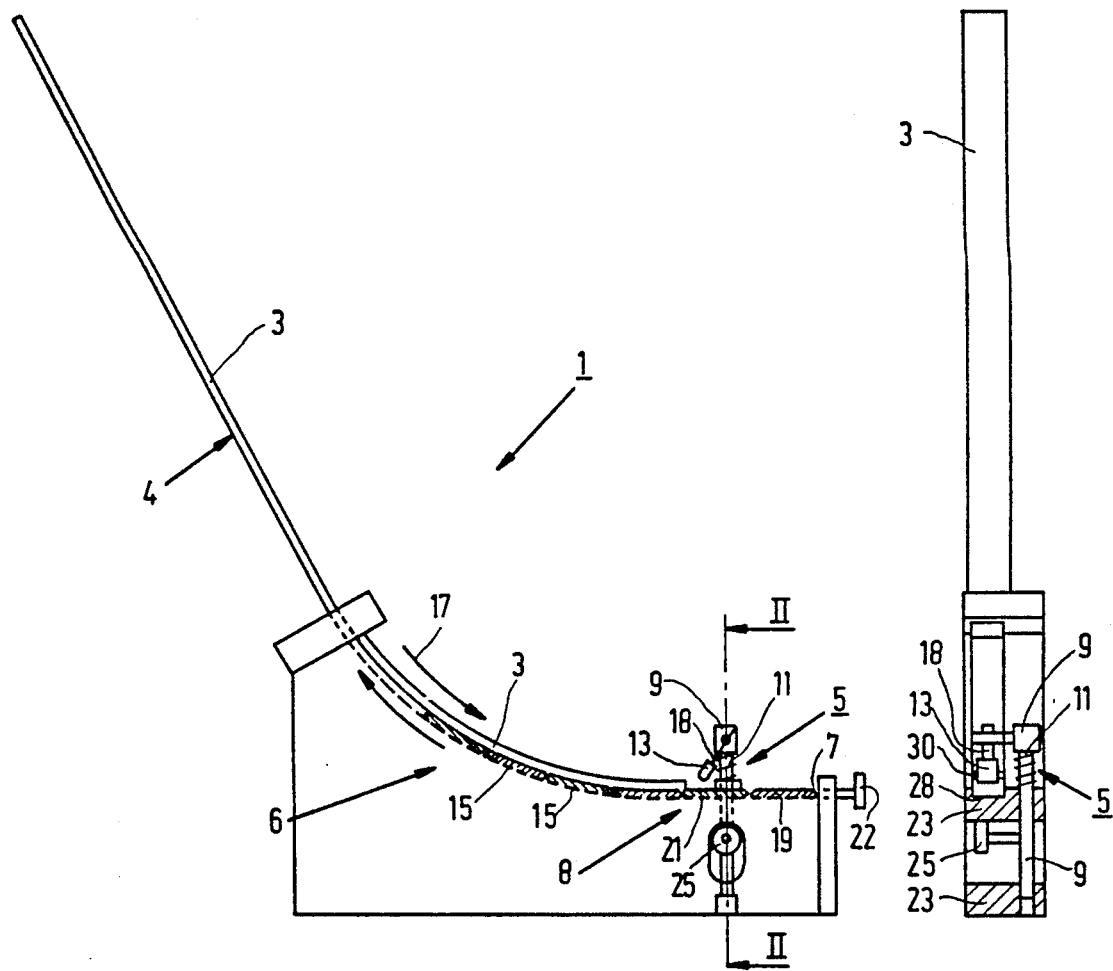

The apparatus 1 shown in FIGS. 1 and 2 comprises an elongate track 3 and a separation device 5. The track 3 has a part 4 directed obliquely upwards, a curved part 6 and a horizontally extending part 8. The separation device 5 has a stop 7, a carriage 9 displaceable in a direction transverse to the track 3 and a pressure foot 13 displaceable under the force of a helical spring 11 with respect to the carriage. The pressure foot 13 is constituted by a rubber cap secured to an arm 18, which is connected to the carriage 9 and will be described hereinafter. Components 15 are supplied in a row of continuous form over the path 3 and are then brought to a standstill by the stop 7; a component to be separated, such as the component 19, being located in a presentation position. The supply of components over the path 3 takes place by means of the force of gravity which acts upon the components, is directed along the track and is counteracted by the friction between the components and the track. By the carriage 9, a movement directed towards the track 3 is performed in a manner to be described below, the pressure foot 13 connected to the carriage exerting a force on a component 21 in the remaining row of components in a direction opposite to the supply direction 17, as a result of which the remaining row of components is displaced in this direction. Thus, the component 19 also is located in the presentation position so as to be freely accessible. This component 19 is removed from the presentation position by means of transport means known per se such as a gripper with pincers (not shown), a suction tube or a conveyor (not shown). Due to the fact that the carriage 9 is then moved away from the track 3, the pressure foot 13 no longer exerts any force on the component 21 in the remaining row so that the latter is displaced under the action of the force of gravity in the supply direction 17 and is finally brought to a standstill against the stop 7. By means of an adjustment screw 22, the stop 7 is adjustable in the direction of the track 3 so that the location of the presentation position can be changed. The track 3 over which the components are supplied is provided with a profiled bottom 28 and a covering plate 30 for closing the track 3 on an upper side. The profile of the bottom 28 and the material of which the bottom 28 is made also depend upon the shape and the dimensions of the components. When the bottom 28 is constructed so as to be detachable and has the form of a strip, it is possible to adapt the apparatus in a simple manner for other kinds of components. The covering plate 30 is open at the area of the pressure foot 13 and of the presentation position. When only a few components are still present in the horizontally extending part 8 of the track, these components are no longer displaced by the force of gravity in the direction of the stop 7. The components may then be blown, for example, in the direction of the stop 7. Of course the supply of components in the track may also be replenished to such an extent that again a sufficient number of components is present in the part 6 of the track 3 so that the force of gravity can ensure the transport of the row of components.

Figure 3:
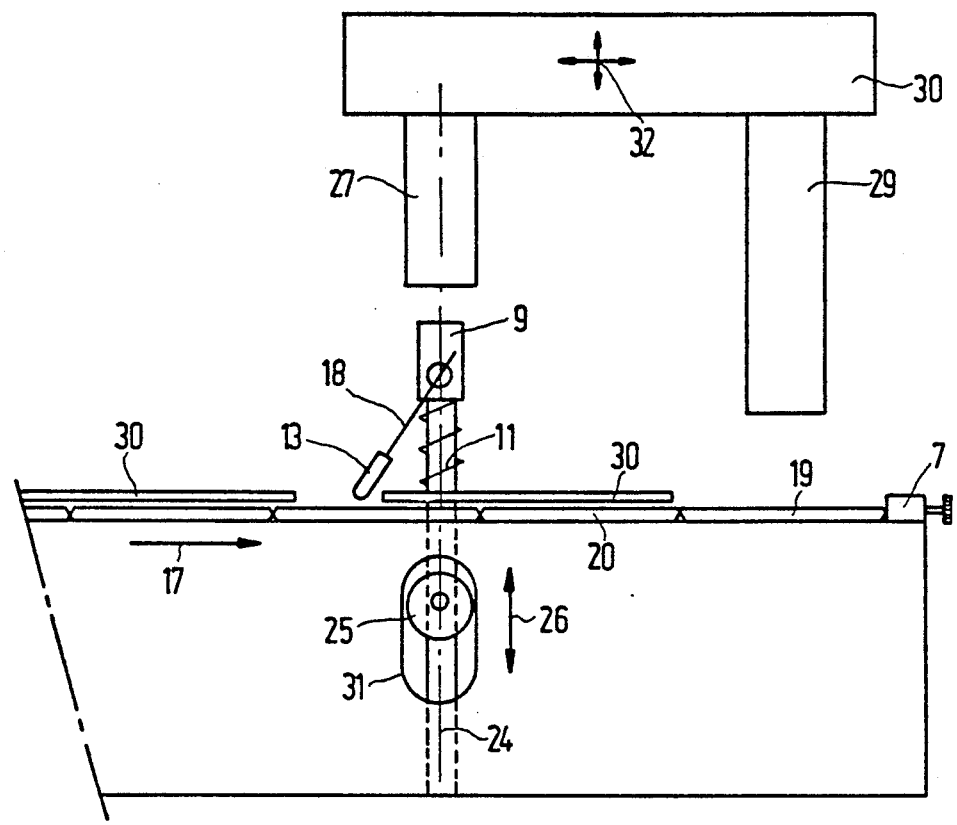
Figure 4:
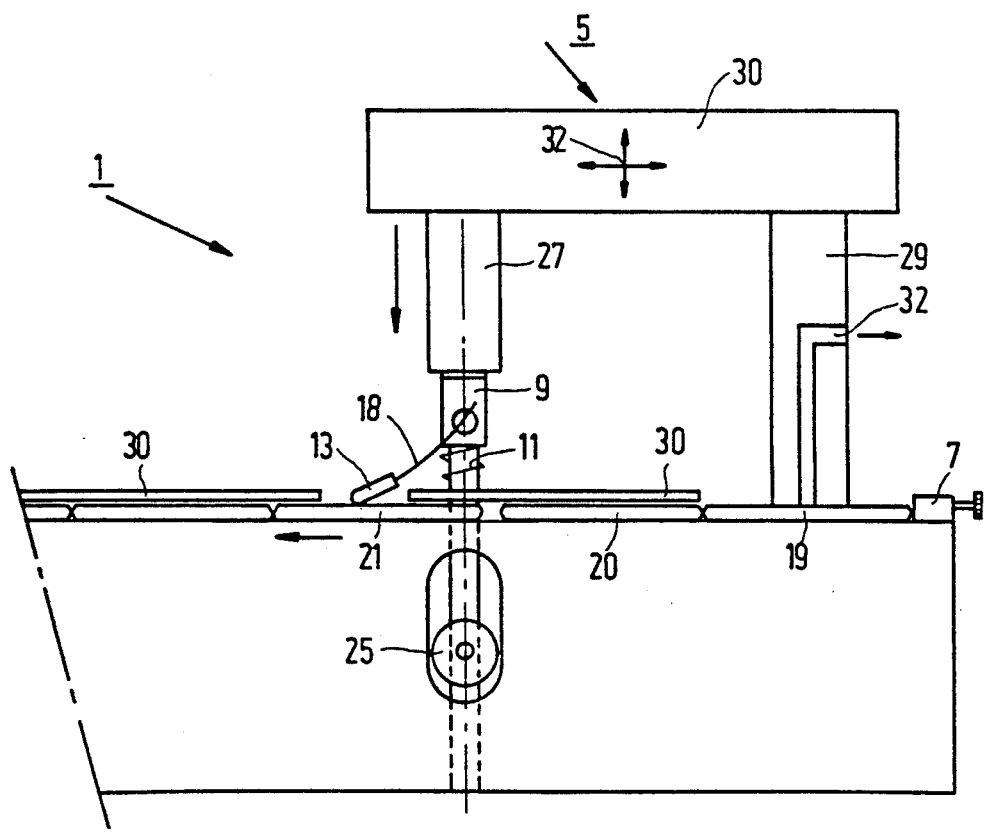

In the first embodiment of the apparatus 1 shown in FIGS. 3 and 4, the arm 18 connected to the carriage 9 comprises a blade spring clamped in the carriage 9. The carriage 9 is slidable in a frame 23 (cf. FIG. 2) and is locked against rotation about a shaft 24 by the wheel 25 connected to the carriage and displaceable in a slot 31 so that the carriage is movable only in the directions of the arrow 26. In FIG. 3, a row of components engages in continuous form the stop 7 and the component 19 is in the presentation position. The pressure foot 13 is not yet in contact with a component. As is indicated in FIG. 4, the component 19 is separated from the remaining row of components in that the carriage 9 is moved with a block 27 driven by a motor (not shown) in the direction toward the track 3 and a gripper 29 coupled to the block 27 and shown diagrammatically is moved simultaneously with the carriage 9 in the direction of the track 3, the pressure foot 13 contacting a component 21 moving this component together with the remaining row in a direction opposite to the supply direction. Between component 21 and the component 19 to be separated is a component 20. Component 20 cannot be displaced by the pressure foot 13 due to the fact that the distance between the pressure foot 13 and the stop 7 is greater than the length of two components. When the gripper 29 touches the component 19 to be separated, the remaining row of components is no longer in contact with the component 20. The component 19 is free and can now be picked up by the gripper 29 by means of a vacuum provided through an opening 32. The component 20 between the component 19 to be separated and the remaining row of components does not disturb removing the component to be separated since component 20 does not exert any force on the component 19. When the gripper 29 has picked up the component 19, the gripper 29 and the block 27 are simultaneously moved away from the track and the carriage 9 is also moved away from the track 3 by the spring force of helical spring 11. The gripper 29 places the component 19 on a carrier, a printed circuit board or a conveyor (not shown). The block 27 and the gripper 29 are coupled to each other by a bridge 30, which is displaceable in directions indicated by arrows 32 by known means, which are therefore not indicated further.

Figure 5:
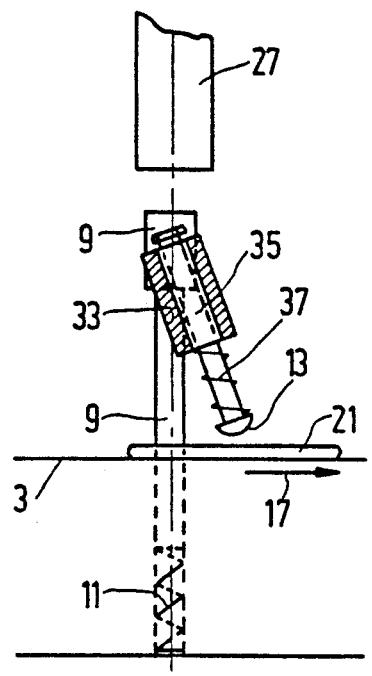
Figure 6:
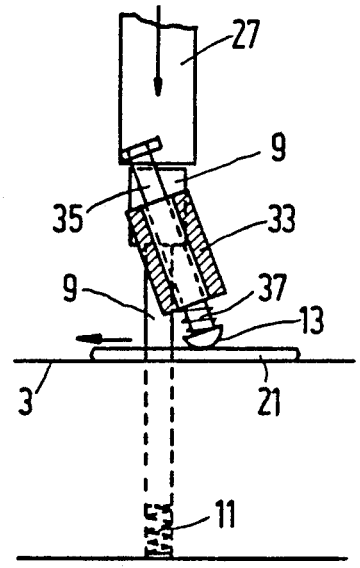

In the second embodiment of the apparatus 1 shown in FIGS. 5 and 6, a pressure foot 13 of synthetic material is connected to a pin 35, which is slidable in a guide 33 and encloses an obtuse angle with the supply direction 17. When the carriage 9 and the guide 33 connected to the carriage perform a movement towards the track 3, the pressure foot 13 comes into contact with the component 21 and the pin 35 is pushed against the force of a spring 37 into the guide 33. A force having a component normal to the track and a component in the direction opposite to the supply direction 17 is exerted on the component 21.

Figure 7:
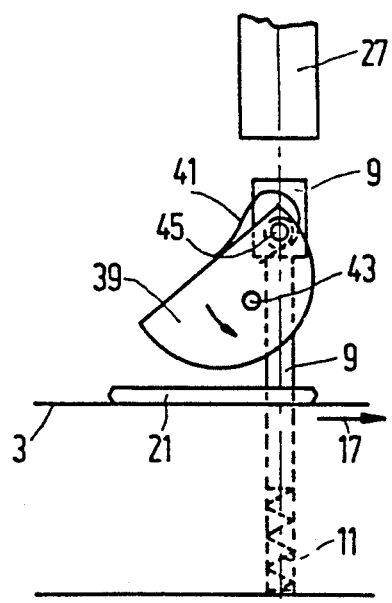
Figure 8:
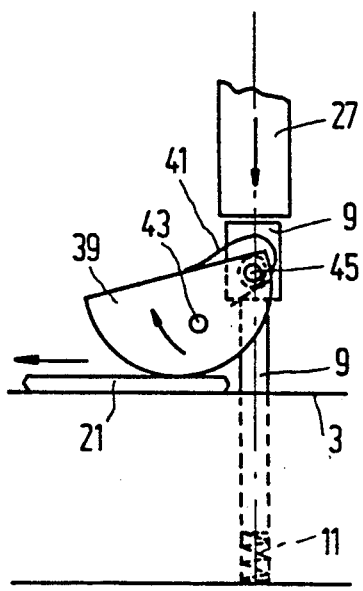

In the third embodiment of the apparatus shown in FIGS. 7 and 8, the pressure foot 13 is replaced with a cam disk 39, which is rotatably connected to the carriage 9 and is held in a starting position by means of a spring 41 and a rod 43 bearing on the carriage 9 (FIG. 7). When the carriage 9 performs a movement directed towards the track 3, the cam disk 39 contacts the component 21 and performs against the spring force a rotation about a shaft 45, as a result of which the component 21 is moved in the direction opposite to the supply direction 17.

By means of the methods and apparatuses described above, electrical components both with wire-shaped connections and with planar connections (so-called chip components) can be transported and separated. In the case of components with wire-shaped connections, of course, an accurate positioning and guiding of these connections has to be ensured. The components may also be transported over the track by means of a conveyor belt extending along the straight part of the track and reversible or irreversible. Although the construction is slightly more costly, the advantage is then obtained of a low degree of dependence upon frictional conditions between tracks and components.

I claim:

1. A method of separating a component from a horizontally extending row of components comprising: displacing the row of components in a continuous form over an elongate track in a supply direction into a separation device; separating a component, after the row has come to a standstill, in the separation device from the horizontally extending row and then discharging the separated component from a presentation position; said separating the component in the separation device including linearly displacing the row of components in a continuous form over a predetermined distance from the component to be separated in a direction opposite to the supply direction and maintaining the row of components at a fixed predetermined distance from the separated component.

2. A method as claimed in claim 1 including exerting a component displacing force on a component in the row of components for causing said displacing of said row of components, the force being composed of a first component transverse to the direction of supply and of a second component in the direction opposite to the supply direction.

3. An apparatus for separating a component from a row of components, said row of components being displaced in a continuous form over an elongate track in a supply direction into a separation device, said apparatus stopping the row of components at the separation device for separating the component, said apparatus comprising:
   stop means for stopping the row with said component to be separated at a presentation position;
   a carriage secured for displacing in directions transverse to said supply direction; and
   pressure applying means secured to the carriage for engaging a component of said row when the carriage is displaced towards said row, said pressure applying means including a foot resiliently secured to said carriage and constructed and oriented relative to said row so as to engage and displace the engaged component in a direction opposite said supply direction in response to the displacement of said carriage to separate the engaged component from at least one component at the presentation position.

4. An apparatus as claimed in claim 3, further including a gripper for gripping and picking up said at least one component and coupled to the carriage, said gripper being displaced simultaneously with the carriage in a direction transverse to the supply direction, said pressure applying means displacing the row of components over a predetermined distance from the at least one component before the gripper picks up the at least one component from the presentation position.

5. An apparatus as claimed in claim 3 wherein said pressure applying means comprises a guide, a pin movably secured to the guide, said foot being at the end of the pin and a spring for resiliently loading the pin relative to the guide, the guide being connected to the carriage and enclosing an obtuse angle with the supply direction.

6. An apparatus as claimed in claim 4 wherein the foot is connected to the carriage by a blade spring.

7. An apparatus as claimed in claim 4 wherein the foot comprises a cam disk resiliently connected to the carriage.

8. An apparatus as claimed in claim 3 wherein the stop means includes means adjustable in the supply direction.

9. An apparatus for separating a component from a row of components, said row of components being displaced in a continuous form over an elongate track in a supply direction into a separation device, said apparatus stopping the row of components at the separation device for separating the component, said apparatus comprising:
   stop means for stopping the row with said component to be separated at a presentation position;
   a carriage secured for displacing in directions transverse to said supply direction;

pressure applying means secured to the carriage for engaging a component of said row when the carriage is displaced towards said row, said pressure applying means being so constructed and so oriented relative to said row so as to displace the engaged component in a direction opposite said supply direction to separate the engaged component from at least one component at the presentation position; and a gripper for gripping and picking up said at least one component and coupled to the carriage, said gripper being displaced simultaneously with the carriage in a direction transverse to the supply direction, said pressure applying means displacing the row of components over a predetermined distance from the at least one component before the gripper picks up the at least one component from the presentation position.

10. An apparatus for separating a component from a row of components, said row of components being displaced in a continuous form over an elongate track in a supply direction into a separation device, said apparatus stopping the row of components at the separation device for separating the component, said apparatus comprising:

stop means for stopping the row with said component to be separated at a presentation position;

a carriage secured for displacing in directions transverse to said supply direction; and pressure applying means secured to the carriage for engaging a component of said row when the carriage is displaced towards said row, said pressure applying means being so constructed and so oriented relative to said row so as to displace the engaged component in a direction opposite said supply direction to separate the engaged component from at least one component at the presentation position, said pressure applying means comprising a guide, a pin movably secured to the guide, a pressure applying foot at the end of the pin and a spring for resiliently loading the pin relative to the guide, the guide being connected to the carriage and enclosing an obtuse angle with the supply direction.

11. An apparatus for separating a component from a row of components, said row of components being displaced in a continuous form over an elongate track in a supply direction into a separation device, said apparatus stopping the row of components at the separation device for separating the component, said apparatus comprising:

stop means for stopping the row with said component to be separated at a presentation position;

a carriage secured for displacing in directions transverse to said supply direction; and pressure applying means secured to the carriage for engaging a component of said row when the carriage is displaced towards said row, said pressure applying means being so constructed and so oriented relative to said row so as to displace the engaged component in a direction opposite said supply direction to separate the engaged component from at least one component at the presentation position, said pressure applying means comprising a pressure foot resiliently secured to the carriage and displaceable in a direction opposite the supply direction in response to displacement of the pressure foot in a direction toward said engaged component.

12. The apparatus of claim 11 wherein the pressure foot is secured to the carriage by a blade spring.

13. The apparatus of claim 11 wherein the pressure foot includes a cam disk secured to the carriage for engaging and displacing said engaged component in said opposite direction.

* * * * *